US011522093B2

(12) United States Patent
Topping

(10) Patent No.: US 11,522,093 B2
(45) Date of Patent: Dec. 6, 2022

(54) OPTOELECTRONIC DEVICE WITH REFLECTIVE FACE

(71) Applicant: Power Roll Limited, Sunderland (GB)

(72) Inventor: Alexander John Topping, Sunderland (GB)

(73) Assignee: Power Roll Limited, Sunderland (GB)

( * ) Notice: Subject to any disclaimer, the term of this patent is extended or adjusted under 35 U.S.C. 154(b) by 78 days.

(21) Appl. No.: 16/493,928

(22) PCT Filed: Mar. 21, 2018

(86) PCT No.: PCT/GB2018/050741
§ 371 (c)(1),
(2) Date: Sep. 13, 2019

(87) PCT Pub. No.: WO2018/172773
PCT Pub. Date: Sep. 27, 2018

(65) Prior Publication Data
US 2021/0119065 A1    Apr. 22, 2021

(30) Foreign Application Priority Data

Mar. 24, 2017  (GB) .................................... 1704738

(51) Int. Cl.
*H01L 31/0236* (2006.01)
*H01L 31/056* (2014.01)
*H01L 31/053* (2014.01)

(52) U.S. Cl.
CPC .... *H01L 31/0236* (2013.01); *H01L 31/02363* (2013.01); *H01L 31/02366* (2013.01); *H01L 31/053* (2014.12); *H01L 31/056* (2014.12)

(58) Field of Classification Search
CPC ........... H01L 31/0236; H01L 31/02363; H01L 31/02366; H01L 31/053; H01L 31/056; H01L 31/02245; H01L 31/022458
See application file for complete search history.

(56) References Cited

U.S. PATENT DOCUMENTS 5,266,125 A * 11/1993 Rand ................... H01L 31/0236
136/244
5,641,362 A    6/1997 Meier
2004/0261839 A1* 12/2004 Gee .................. H01L 31/022458
136/256

(Continued)

FOREIGN PATENT DOCUMENTS

EP    0 776 051    5/1997
EP    3123524    2/2017

(Continued)

OTHER PUBLICATIONS

Search Report Issued in Application No. GB1704738.2 dated Sep. 1, 2017.
Written Opinion for PCT/GB2018/050741 dated May 30, 2018.

*Primary Examiner* — Lindsey A Bernier
(74) *Attorney, Agent, or Firm* — Workman Nydegger P.C.

(57) ABSTRACT

The present invention relates to an optoelectronic device comprising a substrate having a first and a second substantially planar face, a series of grooves in the first substantially planar face, and a first and a second electrical conductor on the second substantially planar face; wherein a first face of the first electrical conductor and a first face of the second electrical conductor are reflective.

14 Claims, 2 Drawing Sheets

(56) References Cited

U.S. PATENT DOCUMENTS

Figure 1:
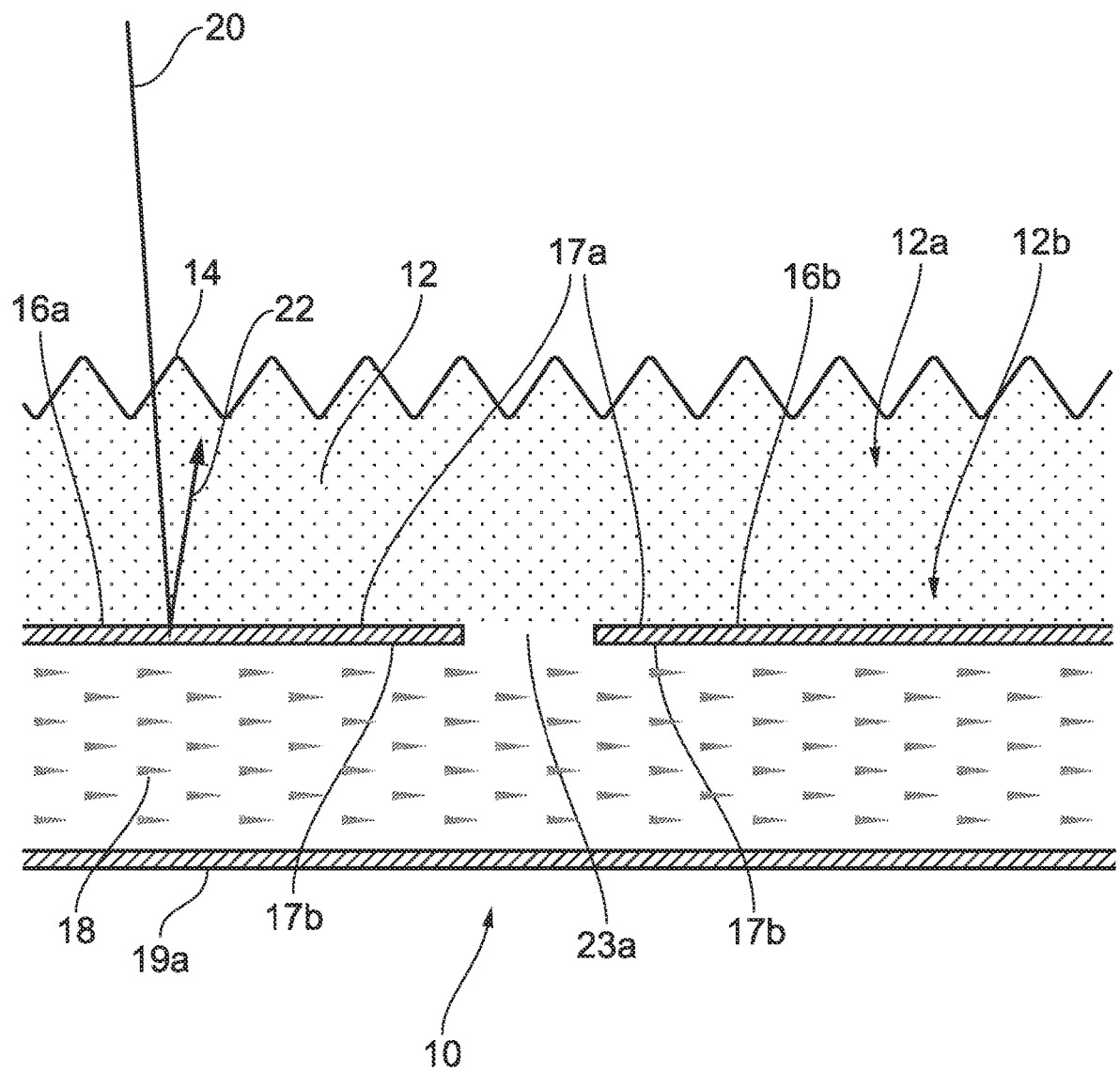

| | | | |
|---|---|---|---|
| 2009/0293931 A1* | 12/2009 | Petti | H01L 31/02167 |
| | | | 136/244 |
| 2012/0043814 A1* | 2/2012 | Deligianni | H01M 10/39 |
| | | | 307/43 |
| 2014/0235883 A1* | 8/2014 | Eguchi | H01G 9/15 |
| | | | 556/32 |
| 2015/0340160 A1 | 11/2015 | Kim et al. | |
| 2015/0372176 A1 | 12/2015 | Topping | |

FOREIGN PATENT DOCUMENTS

| | | | |
|---|---|---|---|
| WO | 2012144534 A | 4/2012 | |
| WO | 2012/144534 | 10/2012 | |
| WO | WO-2015145166 A1 * | 10/2015 | H01L 31/035281 |
| WO | 2018/069681 | 4/2018 | |

\* cited by examiner

# OPTOELECTRONIC DEVICE WITH REFLECTIVE FACE

CROSS-REFERENCE TO RELATED APPLICATIONS

The present application is a 35 U.S.C. § 371 U.S. National Stage of International Application No. PCT/GB2018/050741, filed on Mar. 21, 2018, which claims priority to Great Britain Patent Application No. 1704738.2, filed Mar. 24, 2017, the entire content of each of which is incorporated herein by reference.

The present invention relates to an improved optoelectronic device and more specifically a solar photovoltaic cell. The optoelectronic device may have a reflective face. The optoelectronic device may generate and store electrical energy.

The efficiency with which renewable energy can be harnessed and converted to electrical energy is an ongoing challenge for the energy industry. The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity.

The renewable energy sector is becoming increasingly diverse and the need for energy storage is becoming increasingly important. The responsiveness of renewable energy sources to peak demand is limited but this may be at least partially mitigated if the electricity produced can be stored for release and used when demand is high.

The present invention aims to help increase the efficiency of optoelectronic devices and may address the energy storage challenges faced by the renewable energy sector.

In accordance with a first aspect of the present invention there is provided an optoelectronic device comprising:
  a substrate having a first and a second substantially planar face;
  a series of grooves in the first substantially planar face; and
  a first and a second electrical conductor on the second substantially planar face;
  wherein a first face of the first and second electrical conductors is reflective.

The first faces of the first and second electrical conductors may comprise a mirror. The first faces of the first and second electrical conductors may be reflective of light and/or capable of reflecting light and/or reflect light. The first faces of the first and second electrical conductors may be substantially reflective of light and/or substantially capable of reflecting light.

Each groove of the series of grooves typically has a first and a second face. The first face of the groove is normally coated with a semiconductor material and the second face of the groove is normally coated with a conductor material. The semiconductor material and the conductor material are normally in contact with another semiconductor material in the groove.

In use, the optoelectronic device is exposed to light. The light typically comprises one or more of ultraviolet, infrared, visible. Electrical energy, electricity, normally direct electrical current, is typically generated when the semiconductor and another semiconductor materials are, and normally a junction between the semiconductor and another semiconductors is, exposed to the light.

The inventor of the present invention has appreciated that not all light, typically incident light, that reaches the series of grooves in the first substantially planar face and typically the semiconductor and another semiconductor materials, normally the junction between the semiconductor and another semiconductors, is typically absorbed and some of this light passes into the surrounding substrate.

It may be an advantage of the present invention that the first and second electrical conductors on the second substantially planar face of the substrate can reflect at least some, typically most, of the light that has passed into the surrounding substrate back through the semiconductor and another semiconductor materials, and typically a junction between the semiconductor and another semiconductors, so as to generate more electrical energy, electricity, normally direct electrical current.

The reflection of at least some, typically most, of the light that has passed into the surrounding substrate back through the semiconductor and another semiconductor materials, and typically a junction between the semiconductor and another semiconductors, is greater when the first faces of the first and second electrical conductors are reflective and/or comprise a mirror.

The reflection of at least some, typically most, of the light that has passed into the surrounding substrate back through the semiconductor and another semiconductor materials, and typically a junction between the semiconductor and another semiconductors, normally wants to be with a minimum of further re-reflections and/or as quickly as possible. The reflective and/or mirrored surface of the first faces of the first and second electrical conductors may therefore be one or more of irregular, regular, zig zag and saw-tooth in shape. This may have the advantage that the light that has passed into the surrounding substrate is reflected back at a plurality of different angles, with a minimum of further re-reflections and/or as quickly as possible.

The optoelectronic device may further comprise a first outer electrical conductor spaced from the first and second electrical conductors by a capacitor or supercapacitor material.

In certain embodiments the optoelectronic device comprises a substrate having a first and a second substantially planar face; a series of grooves in the first substantially planar face; and a first and a second electrical conductor on the second substantially planar face; wherein a first face of the first electrical conductor and a first face of the second electrical conductor are reflective and wherein the optoelectronic device further comprises a first outer electrical conductor spaced from the first and second electrical conductors by a layer of capacitor material or supercapacitor material.

In certain embodiments the optoelectronic device comprises a substrate having a first and a second substantially planar face; a series of grooves in the first substantially planar face; and a first and a second electrical conductor on the second substantially planar face; wherein a first face of the first electrical conductor and a first face of the second electrical conductor reflect light; wherein each groove of the series of grooves has a first and a second face, the first face of the groove is coated with a semiconductor material and the second face of the groove is coated with a conductor material, the semiconductor material and the conductor material are in contact with another semiconductor material in the groove and wherein the optoelectronic device further comprises a first outer electrical conductor spaced from the first and second electrical conductors by a layer of capacitor material.

The capacitor material may have characteristics of a supercapacitor. The optoelectronic device normally comprises a supercapacitor material. The capacitor or supercapacitor material may be and/or may be referred to as a dielectric and/or insulator material. The insulator material is typically an electrical insulator material.

The capacitor or supercapacitor material is typically a layer of material. The capacitor or supercapacitor material is typically a high dielectric material. The capacitor or supercapacitor material may be an adhesive material and/or a layer of adhesive.

The capacitor or supercapacitor layer is typically from 20 to 2000 nm thick, usually from 50 to 500 nm thick.

The first and second electrical conductors typically have first and second faces. The first faces of the first and second electrical conductors normally face and/or are in contact with the substrate, the second faces of the first and second electrical conductors normally face and/or are in contact with the capacitor or supercapacitor material.

The first and second electrical conductors on the second substantially planar face are typically electrically insulated from one another. The first and second electrical conductors are typically not in electrical contact with one another. There is normally a gap between the first and second electrical conductors. The capacitor or supercapacitor material may be between the first and second electrical conductors.

The first and second electrical conductors are typically made of metal. The first outer electrical conductor is typically made of metal. The first and second electrical conductors may comprise one or more of aluminium, copper, silver, zinc, lead, antimony, gold, nickel, bismuth, and indium. The first outer electrical conductor may comprise one or more of aluminium, copper, silver, zinc, lead, antimony, gold, nickel, bismuth, and indium.

The first and second electrical conductors on the second substantially planar face are typically busbars. The first electrical conductor may be and/or may be referred to as a first busbar. The second electrical conductor may be and/or may be referred to as a second busbar.

The first and second electrical conductors may provide and/or be part of the positive and negative poles of an electrical circuit.

In use, the capacitor or supercapacitor material typically draws electrical energy from the electrical circuit, stores and then releases the electrical energy. The capacitor or supercapacitor material may store electrical energy using static double-layer capacitance and/or electrochemical pseudocapacitance.

It may be an advantage of the present invention that in use, the first and second electrical conductors are used to collect from and/or convey an electrical charge along a length of the optoelectronic device, these electrical conductors having a lower electrical resistance compared to the first substantially planar face and/or the series of grooves. This typically means that the length of the optoelectronic device and hence the number of grooves and/or number of series of grooves can be increased without an otherwise corresponding decrease in the electrical charge that can be collected.

The series of grooves may include a first outermost groove and a second outermost groove. There may be a first and a second hole in the substrate. The first hole may provide electrical communication between the first outermost groove and the second substantially planar face of the substrate and the second hole may provide separate electrical communication between the second outermost groove and the second substantially planar face of the substrate.

In use, the first and second holes are typically used to carry electrical charge between the first and the second substantially planar faces of the substrate, and typically from the first to the second substantially planar face of the substrate.

The first and second holes typically each have a side or sides. The side or sides may be referred to as an internal surface/internal surfaces. The side or sides of the first and second holes typically comprise the substrate. The side or sides of the first and second holes, and therefore the substrate that the side or sides comprise, may provide the electrical communication. The first and second holes may be empty and/or hollow.

The first hole typically passes through the first substantially planar face of the substrate proximate to the first outermost groove and through the first electrical conductor on the second substantially planar face of the substrate. The second hole typically passes through the first substantially planar face of the substrate proximate to the second outermost groove and through the second electrical conductor on the second substantially planar face of the substrate.

The first and second holes may be two of a plurality of holes. The plurality of holes may comprise a first group of holes including the first hole and a second group of holes including the second hole. The holes of the first group of holes may all pass through and/or be in electrical communication with the first electrical conductor. The holes of the second group of holes may all pass through and/or be in electrical communication with the second electrical conductor.

The first and second holes may have a diameter of from 5 to 2000 microns, typically from 100 to 500 microns. There may be at least one hole for every from 3 to 10 $cm^2$ of the substrate, typically at least one hole for every 5 $cm^2$ of the substrate. There may be at least one hole for every from 3 to 10 $cm^2$ of substrate length, typically at least one hole for every 5 $cm^2$ of substrate length.

The side or sides of the first and second holes are normally coated with the conductor material and/or the semiconductor material. The aspect ratio of the depth to the width of the first and second holes is typically such that the conductor material and/or the semiconductor material coats enough of the side or sides of the first and second holes to establish the electrical communication between the first and second outermost grooves and the second substantially planar face of the substrate. The first and second holes may be at least partially filled with a filler material to increase the reliability and/or effectiveness of the electrical communication between the first and second outermost grooves and the second substantially planar face of the substrate.

The series of grooves may comprise a first and a second series of grooves. The substrate may further comprise a channel between the first and second series of grooves.

It may be an advantage of the present invention that the capacitor or supercapacitor material aids operation of the optoelectronic device by providing electrical energy when energy demand spikes, such as a surge when devices connected to the optoelectronic device are turned on.

The capacitor or supercapacitor material typically provides the function of a supercapacitor, also referred to as an ultracapacitor. The function of the capacitor or supercapacitor may be provided by the capacitor or supercapacitor material alone or may require the interaction of the capacitor or supercapacitor material with one or more of the semiconductor material, conductor material and another semiconductor material.

The optoelectronic device typically further comprises a protective layer on the first outer electrical conductor. The first outer electrical conductor typically has a first and a second substantially planar face. The capacitor or supercapacitor material is typically in contact and/or on the first substantially planar face. The protective layer is typically in contact and/or on the second substantially planar face.

The protective layer may be and/or may provide one or more of physical protection, environmental protection, a gas barrier and electrical insulation.

The optoelectronic device may be in electrical communication with a load. The load is typically an electrical component that consumes electrical energy. The load may for example be a light bulb.

In use, the capacitor or supercapacitor material typically stores electrical energy that the load does not consume. In this way, excess electrical energy can be stored for future use by the load. There is therefore electrical energy available to the load when the optoelectronic device is not generating sufficient electrical energy.

It may be an advantage of the present invention that the optoelectronic device generates and stores electrical energy.

The first face of the groove may be longer than the second face of the groove or the second face of the groove may be longer than the first face of the groove. When the first face of the groove is longer than the second face of the groove the first face is typically at least 1000 nm long and the second face is typically at least 300 nm long. When the second face of the groove is longer than the first face of the groove the second face is typically at least 1000 nm long and the first face is typically at least 300 nm long.

When the first face of the groove is longer than the second face of the groove or the second face of the groove is longer than the first face of the groove, the groove typically has an asymmetric shape.

The length of the first face of the groove is normally measured from a junction between the first face of the groove and the first surface of the substrate and a junction between the first and second faces of the groove. The length of the second face of the groove is normally measured from a junction between the second face of the groove and the second surface of the substrate and a junction between the second and first faces of the groove.

Preferably the first face of the groove is longer than the second face of the groove. The first face of the groove is typically at least twice the length of the second face of the groove.

At the second side of the groove there is typically a gap between the semiconductor material on the second side of the groove and the another semiconductor material in the groove.

It may be an advantage of the present invention that, in use, the gap between the semiconductor material on the second side of the groove and the another semiconductor material in the groove one or more of stops, mitigates and substantially reduces the occurrence of shunting across the groove and therefore typically between the first and second sides of the groove.

The gap is typically an air gap. The gap may be filled with another material, preferably a non-conducting and/or electrically insulative material. The gap is typically a form of electrical insulation between the semiconductor material on the second side of the groove and the another semiconductor material in the groove.

The gap between the semiconductor material and the another semiconductor material at the second side of the groove, typically means that the another semiconductor material is not in contact, and/or is insulated from, the semiconductor material.

The gap between the semiconductor material on the second side of the groove and the another semiconductor material in the groove may be at least 1 nm in length, normally at least 20 nm in length and typically at least 100 nm in length.

It may be an advantage of the present invention that the gap makes the optoelectronic device less susceptible, typically resistant, to shorting and/or shunting across the groove. The gap in between the semiconductor and the another semiconductor material is designed to mitigate a charge transfer path/route from the semiconductor material on one side of the groove, through the another semiconductor and into the semiconductor material on the opposite side of the groove. This typically makes the optoelectronic device less susceptible to shunting. Shunting is a parasitic parallel resistance across the optoelectronic device. Maximising shunt resistance makes the optoelectronic device more efficient.

The first face of the groove is normally at a first angle relative to a normal from the substrate and the second face of the groove is normally at a second angle relative to the normal from the substrate. The first angle is normally from 45 to less than or equal to 90°. The second angle is normally from 45 to less than or equal to 90°.

The conductor material is normally one or more of on, in contact with and coated on the second face of the groove and second surface of the substrate adjacent the groove. The conductor material may further be one or more of on, in contact with and coated on the first surface of the substrate adjacent the groove.

The semiconductor material is normally one or more of on, in contact with and coated on the first face of the groove and first surface of the substrate adjacent the groove. The semiconductor material may further be one or more of on, in contact with and coated on the second surface of the substrate adjacent the groove.

The another semiconductor typically at least partially fills the groove and/or fills the groove between the first and second faces of the groove.

The another semiconductor in the groove may be referred to as having a surface between the first and second faces of the groove. The surface of the another semiconductor is typically not parallel and normally not substantially parallel to the plane of the substrate. The surface of the another semiconductor is typically at an angle and/or tilted with respect to the plane of the substrate.

The surface of the another semiconductor may be inclined or declined relative to a normal from the substrate. The surface of the another semiconductor may be non-normal to a normal from the substrate. When the surface of the another semiconductor is one or more of inclined or declined and non-normal relative to a normal from the substrate, the surface of the another semiconductor may be referred to as tilted relative to the groove.

The first surface of the another semiconductor may be parallel at least in part to the first face of the groove and the second surface of the another semiconductor may be parallel at least in part to the second face of the groove.

There may be an aperture in the another semiconductor material. The aperture may be referred to as a gap and/or crack. The shape of the aperture is typically substantially conformal with the shape of the groove. The shape of the aperture may match the shape of the groove.

The first and second surfaces of the another semiconductor may be referred to as sides of the aperture. The sides of the aperture may be substantially parallel to the first and second faces of the groove respectively. The sides of the aperture may be steeper or shallower than the first and/or second faces of the groove but are still considered substantially parallel.

The first and the second face of the groove typically define a cavity of the groove therebetween. The aperture normally extends down into the cavity. The aperture typically extends down into the cavity between the first and second face of the groove.

The another semiconductor material may occupy from 15 to 75%, optionally from 20 to 50% of the volume of the cavity of the groove. When for example the another semiconductor material occupies from 20 to 50% of the volume of the cavity, a remaining 70 to 40% corresponds to the aperture in the another semiconductor material. The conductor material and semiconductor material account for the remaining volume. The volume of the cavity occupied by the another semiconductor material may be related to the shape of the groove.

The aperture in the another semiconductor material may extend up to 90%, optionally from 20 to 80% and typically from 50 to 80% of the distance into the cavity of the groove. It may be an advantage of the present invention that an aperture in the semiconductor material that extends about 50% of the distance into the cavity from the top of the cavity may increase the electrical current generated by the optoelectronic device. The distance the aperture in the semiconductor material extends into the cavity from the top of the cavity may be related to the shape of the groove.

The semiconductor material may coat and/or cover from 20 to 80%, normally from 40 to 60% and typically about 50% of the first face of the groove. The semiconductor material may coat and/or cover about 75% of the first face of the groove. The conductor material may coat and/or cover from 20 to 80%, normally from 40 to 60% and typically about 50% of the second face of the groove. The conductor material may coat and/or cover about 75% of the second face of the groove.

It may be an advantage of the present invention that when the semiconductor material and/or conductor material coats and/or covers about 50%, preferably about 75%, of the first face and/or second face of the groove respectively, one or more of the efficiency, electrical current generated, power output and photoelectric conversion efficiency of the optoelectronic device is increased.

The another semiconductor in the groove may be, and/or may be referred to as, coated on the first and second face of the groove. The coat of the another semiconductor material may be from 50 nm to 1000 nm thick, normally from 100 nm to 500 nm thick and typically from 100 nm to 200 nm thick. The coat of the another semiconductor material may therefore be referred to as a relatively thin coating.

The optoelectronic device is typically a solar photovoltaic cell.

Figure 2:
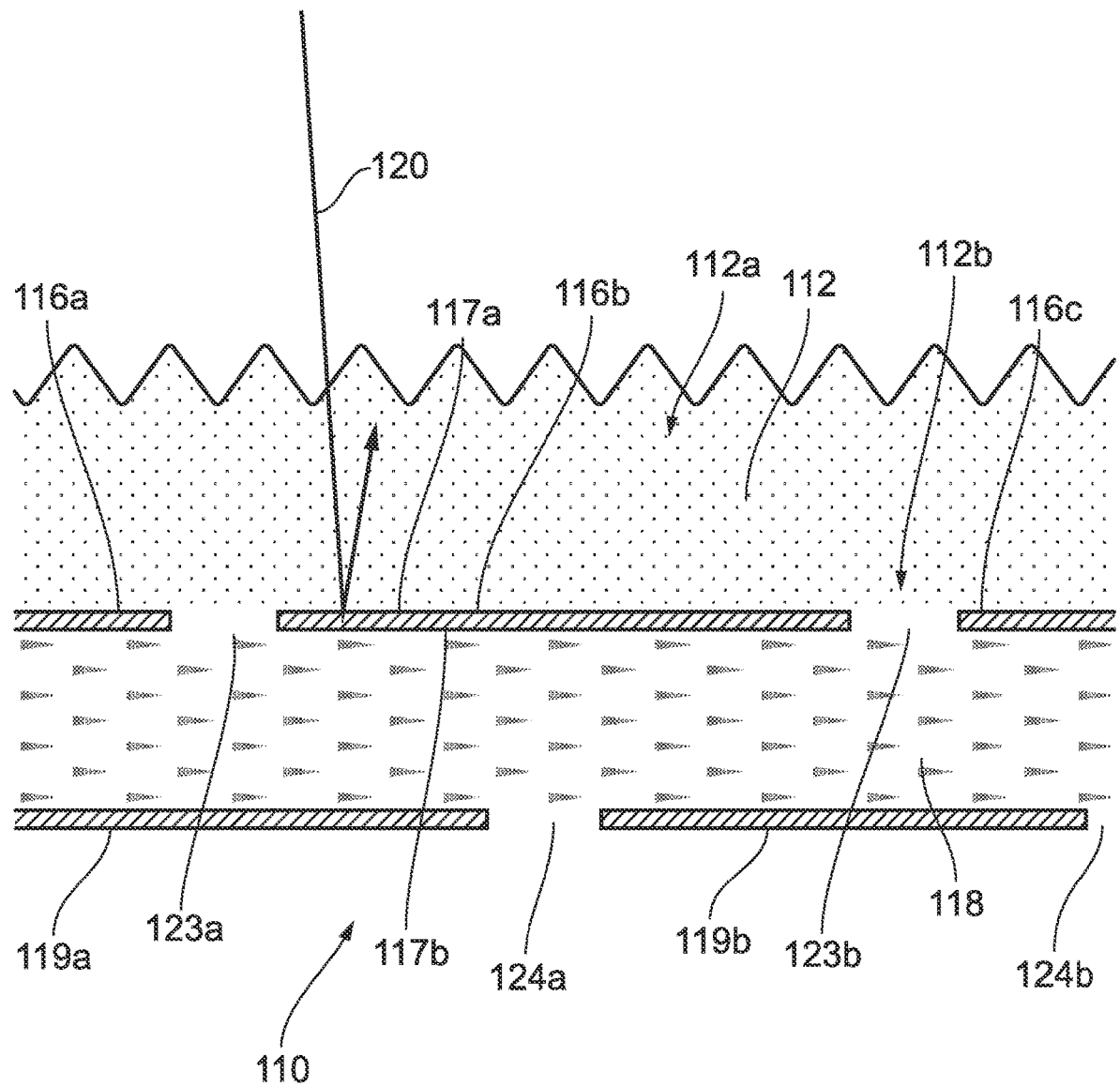

An embodiment of the invention will now be described by way of example only and with reference to the accompanying drawings, in which:

FIG. 1 is a schematic representation of the optoelectronic device of the present invention; and FIG. 2 is a schematic representation of an alternative optoelectronic device of the present invention.

FIG. 1 shows an optoelectronic device 10 comprising a substrate 12 having a first 12a and a second 12b substantially planar face. The optoelectronic device 10 has a series of grooves 14 in the first substantially planar face 12a. There is a first 16a and a second 16b electrical conductor on the second 12b substantially planar face of the substrate 12. There is a first outer electrical conductor 19a spaced from the first 16a and second 16b electrical conductors by a capacitor material 18.

There is a gap 23a between the first 16a and second 16b electrical conductors.

The first 16a and second 16b electrical conductors on the second substantially planar face 12b are busbars. The first 16a and second 16b electrical conductors have first 17a and second 17b faces. The first faces 17a of the first 16a and second 16b electrical conductors are in contact with the substrate 12. The second faces 17b of the first 16a and second 16b electrical conductors are in contact with the capacitor material 18.

The first faces 17a of the first 16a and second 16b electrical conductors are reflective. The first faces 17a of the first 16a and second 16b electrical conductors are mirrors.

Each groove of the series of grooves of the first and second series of grooves has a first and a second face and a cavity therebetween. The first face is coated with a semiconductor material and the second face coated with a conductor material (not shown). The cavity is at least partially filled with another semiconductor material (not shown).

Not all the incident light 20 that reaches the series of grooves 14 in the first substantially planar face 12a and normally the junction (not shown) between the semiconductor and the another semiconductor is absorbed and some of this light 20 passes into the surrounding substrate 12. The first 16a and second 16b electrical conductors on the second substantially planar face 12b of the substrate 12 reflect 22 some of the light that has passed into the surrounding substrate back through the series of grooves 14 and the semiconductor and the another semiconductor and the junction between the semiconductor and the another semiconductor. More electrical energy can therefore be generated.

In use, the optoelectronic device is exposed to light. When a junction between the semiconductor and another semiconductor is exposed to the light, electrical energy is generated. The optoelectronic device is in electrical communication with a load (not shown). The load is an electrical component that consumes electrical energy. The load may for example be a light bulb.

In use, the capacitor material stores the electrical energy or charge that the load does not consume. In this way, excess electrical energy is stored for future use by the load. There is therefore electrical energy available to the load when the optoelectronic device is not generating electrical energy.

The optoelectronic device generates and stores electrical energy.

FIG. 2 shows an optoelectronic device 110 comprising a substrate 112 having a first 112a and a second 112b substantially planar face. Many of the features of the optoelectronic device shown in FIG. 2 are also present in the optoelectronic device shown FIG. 1. Some of the same or similar features are not labelled again in FIG. 2 and when they are, they are given the same reference numeral +100.

The optoelectronic device 110 has a series of grooves in the first substantially planar face 112a. There is a first 116a, a second 116b and a third 116c electrical conductor on the second 112b substantially planar face of the substrate 112. There is a first 119a and a second 119b outer electrical conductor spaced from the first 116a, second 116b and third 116c electrical conductors by a supercapacitor material 118.

The first faces 117a of the first 116a, second 116b and third 116c electrical conductors are reflective like a mirror.

There is a gap 123a between the first 116a and second 116b electrical conductors. There is a gap 123b between the second 116b and third 116c electrical conductors. There is a gap 124a between the first outer 119a and second 119b outer electrical conductors.

It may be an advantage of the present invention that the shallower the depth of the supercapacitor material 118, that is the smaller the vertical distance between the first 116a, second 116b and third 116c electrical conductors and the first 119a and second 119b outer electrical conductors as shown in FIG. 2, the lower the charge permeation through the overall device and the greater the tortious path.

It may be an advantage of the present invention that the smaller the gaps 123a, 123b and 124a, that is the smaller the horizontal distance between the first 116a, second 116b and third 116c electrical conductors and the first 119a and second 119b outer electrical conductors respectively, as shown in FIG. 2, the greater the environmental stability of the device.

Electrical charge transfer through the device shown in FIG. 2 can be from the first electrical conductor 116a to the first outer electrical conductor 119a, then to the second electrical conductor 116b, then to the second outer electrical conductor 119b, and then to the third electrical conductor 116c. The device 110 may extend horizontally, as shown in FIG. 2, in both directions. There may be many more electrical conductors 116x and outer electrical conductors 119x. Electrical charge may therefore be transferred along the device 110, from for example left to right as shown in FIG. 2.

Modifications and improvements can be incorporated herein without departing from the scope of the invention.

The invention claimed is:

1. An optoelectronic device comprising:
    a substrate having a first and a second substantially planar face;
    a series of grooves in the first substantially planar face; and
    a first and a second electrical conductor on the second substantially planar face;
    wherein a first face of the first electrical conductor and a first face of the second electrical conductor are reflective, and
    wherein each groove of the series of grooves has a first and a second face, the first face of each groove is coated with a first semiconductor material so that the first semiconductor material coats from 20 to 80% of the first face, and the second face of each groove is coated with a conductor material so that the conductor material coats from 20 to 80% of the second face,
    wherein the first semiconductor material and the conductor material are in contact with a second semiconductor material at least partially filling each groove such that within each groove a junction is formed between the first semiconductor and the second semiconductor materials, and
    wherein the optoelectronic device further comprises a first outer electrical conductor and the first outer electrical conductor is spaced from the first and second electrical conductors by either a layer of capacitor material or by a layer of supercapacitor material.

2. An optoelectronic device according to claim 1, wherein the layer of capacitor material or the layer of supercapacitor material is from 50 to 500 nm thick.

3. An optoelectronic device according to claim 1, wherein the first and second electrical conductors also have second faces, the first faces of the first and second electrical conductors face and are on the second substantially planar face of the substrate, and either:
    the second faces of the first and second electrical conductors face and are in contact with the capacitor material; or
    the second faces of the first and second electrical conductors face and are in contact with the supercapacitor material.

4. An optoelectronic device according to claim 1, wherein the first and second electrical conductors on the second substantially planar face are electrically insulated from one another.

5. An optoelectronic device according to claim 1, wherein there is a gap between the first and second electrical conductors.

6. An optoelectronic device according to claim 1, wherein the first and second electrical conductors comprise one or more of aluminium, copper, silver, zinc, lead, antimony, gold, nickel, bismuth, and indium.

7. An optoelectronic device according to claim 1, wherein the first outer electrical conductor comprises one or more of aluminium, copper, silver, zinc, lead, antimony, gold, nickel, bismuth, and indium.

8. An optoelectronic device according to claim 1, wherein the first and second electrical conductors on the second substantially planar face are busbars.

9. An optoelectronic device according to claim 1, wherein the first and second electrical conductors are at least part of the positive and negative poles of an electrical circuit.

10. An optoelectronic device according to claim 1, wherein the series of grooves includes a first outermost groove and a second outermost groove, the optoelectronic device further comprising a first and a second hole in the substrate, the first hole providing electrical communication between the first outermost groove and the second substantially planar face of the substrate and the second hole providing separate electrical communication between the second outermost groove and the second substantially planar face of the substrate.

11. An optoelectronic device according to claim 10, wherein the first and second holes have a diameter of from 100 to 500 microns.

12. An optoelectronic device according to claim 1, wherein the first face of each groove is longer than the second face of each groove.

13. An optoelectronic device according to claim 1, wherein the optoelectronic device is a solar photovoltaic cell.

14. An optoelectronic device comprising:
    a substrate having a first and a second substantially planar face;
    a series of grooves in the first substantially planar face; and
    a first and a second electrical conductor on the second substantially planar face;
    wherein a first face of the first electrical conductor and a first face of the second electrical conductor are reflective,
    wherein each groove of the series of grooves has a first and a second face, the first face of each groove is coated with a first semiconductor material so that the first semiconductor material coats from 20 to 80% of the first face, and the second face of each groove is coated with a conductor material so that the conductor material coats from 20 to 80% of the second face, wherein the first semiconductor material and the conductor material are in contact with a second semiconductor material at least partially filling each groove such that within each groove a junction is formed between the first semiconductor and the second semiconductor materials, wherein the first face of the first electrical conductor and the first face of the second electrical conductor reflect light that has passed into the substrate back through the first semiconductor and the second semiconductor materials in each groove, and wherein the optoelectronic device further comprises a first outer electrical conductor, and the first outer electrical conductor is spaced from the first and second electrical conductors by either a layer of capacitor material or by a layer of supercapacitor material.

* * * * *